United States Patent [19]
Mukai et al.

[11] Patent Number: 5,608,229
[45] Date of Patent: Mar. 4, 1997

[54] QUANTUM BOX SEMICONDUCTOR DEVICE

[75] Inventors: Kohki Mukai; Nobuyuki Ohtsuka, both of Kawasaki, Japan

[73] Assignee: Fujitsu Limited, Kawasaki, Japan

[21] Appl. No.: 506,916

[22] Filed: Jul. 26, 1995

[30] Foreign Application Priority Data

Sep. 16, 1994 [JP] Japan .................................. 6-222107

[51] Int. Cl.$^6$ .................................................. H01L 29/06
[52] U.S. Cl. .............................. 257/14; 257/14; 257/15; 257/17; 257/22; 372/44
[58] Field of Search ................... 257/14, 17, 15, 257/22, 28, 29; 372/44

[56] References Cited

U.S. PATENT DOCUMENTS

| | | | |
|---|---|---|---|
| 4,205,329 | 5/1980 | Dingle et al. | 357/16 |
| 4,748,132 | 5/1988 | Fukuzawa et al. | 437/25 |
| 4,883,769 | 11/1989 | Au Coin et al. | 437/110 |
| 5,187,715 | 2/1993 | Weisbuch et al. | 372/46 |
| 5,189,679 | 2/1993 | Derry et al. | 372/45 |
| 5,281,543 | 1/1994 | Fukuzawa et al. | 437/29 |
| 5,293,050 | 3/1994 | Chapple-Sokol et al. | 257/17 |
| 5,313,484 | 5/1994 | Arimoto | 372/46 |
| 5,371,379 | 12/1994 | Narusawa | 257/14 |

FOREIGN PATENT DOCUMENTS

| | | |
|---|---|---|
| 61-34927 | 2/1986 | Japan . |
| 61-152009 | 7/1986 | Japan . |
| 1-94614 | 4/1989 | Japan . |

Primary Examiner—Sara W. Crane
Assistant Examiner—Douglas Wille
Attorney, Agent, or Firm—Armstrong, Westerman, Hattori, McLeland & Naughton

[57] ABSTRACT

A semiconductor device having: an underlie having a semiconductor surface capable of growing thereon single crystal; and a first semiconductor layer, the first semiconductor layer including: a first region of group III–V compound semiconductor epitaxially grown on generally the whole area of the semiconductor surface; and second regions of group III–V compound semiconductor disposed and scattered in the first region, the second region having a different composition ratio of constituent elements from the first region, wherein lattice constants of the first and second regions in no strain state differ from a lattice constant of the semiconductor surface, and a difference between the lattice constant of the second region in no strain state and the lattice constant of the semiconductor surface is greater than a difference between the lattice constant of the first region in no strain state and the lattice constant of the semiconductor surface. A semiconductor device having a quantum box structure is provided capable of being manufactured by relatively simple processes.

18 Claims, 15 Drawing Sheets

5,608,229

QUANTUM BOX SEMICONDUCTOR DEVICE

BACKGROUND OF THE INVENTION a) Field of the Invention

The present invention relates to semiconductor devices, and more particularly to semiconductor devices having the quantum mechanical effects given by a quantum box structure which three-dimensionally confines a quantum.

b) Description of the Related Art

In the course of advancement of semiconductor manufacturing processes, a nanoscale fine film growing technology and a fine pattern fabrication technology have been used. With these fine film growing technology and fine pattern fabrication technology, integration of circuit devices have been raised or a strained quantum well laser utilizing the quantum mechanics effects has been practiced.

In manufacturing conventional semiconductor devices, a limit to fine patterning by a photolithography technique and a limit to integration because of heat generated by motion of many electrons have been pointed out. Requirements of the performance of a semiconductor laser are also becoming severe, and a semiconductor laser capable of stably operating under a large temperature variation has been needed recent years. A strained quantum well laser is difficult to meet such severe requirements.

It has been considered that these requirements can be met theoretically by use of a quantum box structure which three-dimensionally confines a quantum. One quantum box allows only two free electrons (in some cases, several free electrons) to be contained therein. The state density is localized in the form of a delta function, at a certain wave number vector. For example, of optical semiconductor devices, an optical modulator of high efficiency can be manufactured in accordance with a delta function state density. Temperature characteristics of a semiconductor laser are also considered being improved by a rise of a differential gain because variation in the thermal distribution of charge carries is suppressed.

Various methods of realizing a quantum box structure have been proposed through developments of conventional fine pattern fabrication technology. For example, these methods include a method using electron beam lithography, a method of forming a quantum box structure near at the apex of a pyramid crystal grown on an opening of a mask pattern, a method using lateral growth on a slightly slanted substrate at the initial growth stage, and a method using atom manipulation by scanning tunneling microscope (STM) technique.

To positively use the quantum mechanical effects inherent to a quantum box structure, it is important to make the sizes of quantum boxes uniform to the degree of atomic scale. However, a method of forming quantum boxes proposed through development of conventional fine pattern fabrication technology works crystal artificially and is difficult to suppress a dispersion of worked sizes to the degree of atomic scale.

In addition to the above, a manufacturing system becomes complicated and is not suitable for industrial production because of a need of multi-stage work processes. These multi-stage work processes inevitably lower the crystal property because of generation of crystal defects such as mixture of impurities, dislocation, and vacancies.

SUMMARY OF THE INVENTION

It is an object of the present invention to provide a semiconductor device having a quantum box structure capable of being formed by relatively simple manufacturing steps.

According to one aspect of the present invention, there is provided a semiconductor device including: an underlie having a semiconductor surface capable of growing thereon single crystal; and a first semiconductor layer, the first semiconductor layer including: a first region of group III–V compound semiconductor epitaxially grown on generally the whole area of the semiconductor surface; and second regions of group III–V compound semiconductor disposed and scattered in the first region, the second region having a different composition ratio of constituent elements from the first region, wherein lattice constants of the first and second regions in no strain state differ from a lattice constant of the semiconductor surface, and a difference between the lattice constant of the second region in no strain state and the lattice constant of the semiconductor surface is greater than a difference between the lattice constant of the first region in no strain state and the lattice constant of the semiconductor surface.

The first semiconductor layer has preferably a thickness of 2 to 40 nm, and the second region has an oblate sphere shape flattened in a thickness direction of the second region, a height of the second region being generally the same as a thickness of the first semiconductor layer.

The first semiconductor layer may be group III–V compound semiconductor containing In as a group III element, and a molar composition ratio of In of the second region to all group III elements may be about 0.7 or smaller and larger than a molar composition ratio of In of the first region by about 0.2 or more.

A second semiconductor layer may be formed on the first semiconductor layer, the second semiconductor layer having generally the same lattice constant as the lattice constant of the semiconductor surface.

The underlie may include a substrate having an upper surface and a third semiconductor layer epitaxially grown on the upper surface of the substrate, the third semiconductor layer being formed with the semiconductor surface on an upper surface thereof.

A lattice constant of the third semiconductor layer in no strain state may differ from a lattice constant of an upper surface of the semiconductor substrate, and strains in an upper portion of the third semiconductor layer are more relaxed than in a lower portion thereof.

A first spacer layer of group III–V compound semiconductor may be formed between the third semiconductor layer and the first semiconductor layer, wherein a difference between the lattice constant of the second region in no strain state and a lattice constant of the first spacer layer in no strain state is greater than a difference between the lattice constant of the second region in no strain state and the lattice constant of the semiconductor surface.

A second spacer layer of group III–V compound semiconductor may be directly formed on an upper surface of the first semiconductor layer, wherein a difference between the lattice constant of the second region in no strain state and a lattice constant of the second space layer in no strain state is greater than a difference between the lattice constant of the second region in no strain state and the lattice constant of the semiconductor surface.

It is preferable to set the thicknesses of the first and second spacer layers to 2 nm or more.

Strains are locally concentrated in group III–V compound semiconductor epitaxially grown on a lattice mismatching surface of an underlie semiconductor, and small regions having relatively large strains are formed and scattered in a region having relatively small strains. If this fine region has an energy gap smaller than a region surrounding the fine region, it functions as a quantum box which three-dimensionally confines a quantum.

This fine region has an oblate sphere shape flattened in a thickness direction. It can be considered that the fine region epitaxially grows so as to reduce a strain energy as small as possible.

If a semiconductor layer having quantum boxes is Formed by group III–V compound semiconductor containing In, the molar composition ratio of In of the fine region with concentrated strains is about 0.7 or smaller and is larger than the peripheral region by about 0.2 or more. Since a region having a large In composition has an energy gap smaller than a region having a small In composition, the fine region becomes a quantum box.

A buffer layer may be formed on a semiconductor substrate to form a semiconductor layer having quantum boxes on the buffer layer. By changing the composition of the buffer layer, the wavelength of a PL light emission from a quantum box can be controlled.

A photo-luminescence (PL) light emission intensity of a quantum box can be increased by relaxing strains in the buffer layer.

If a spacer layer is formed between the buffer layer and the semiconductor layer with quantum boxes to obtain a larger lattice mismatch between a quantum box and the buffer layer, quantum boxes are generated more. If a spacer layer is made thick, particularly to 2 nm or more, a light emission intensity of a quantum box can be increased.

As stated above, quantum boxes with a uniform atomic size and a high crystal quality can be formed by relatively simple manufacturing processes. Use of these quantum boxes improves the integration and function of semiconductor devices.

DETAILED DESCRIPTION OF THE PREFERRED EMBODIMENTS

The first embodiment of the invention will be described with reference to FIGS. 1 to 9.

Figure 1:
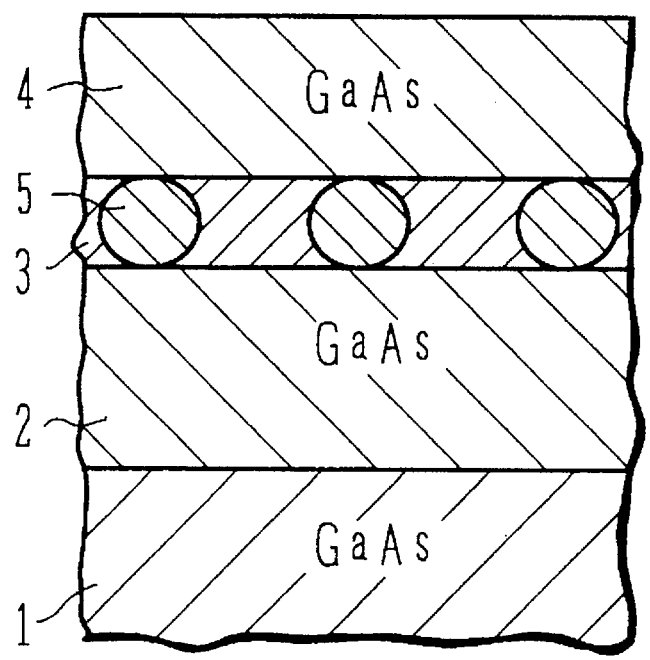
FIG. 1 is a cross sectional view of a semiconductor laminate structure according to a first embodiment.

FIG. 1 shows the laminate structure of a semiconductor device of the first embodiment. On the surface of a GaAs substrate 1, a GaAs buffer layer 2, an InGaAs layer 3 having scattered quantum boxes 5, and a GaAs cap layer 4 are epitaxially grown. This structure has the layer 3 having quantum boxes 5 (hereinafter called a "quantum box layer").

Figure 2:
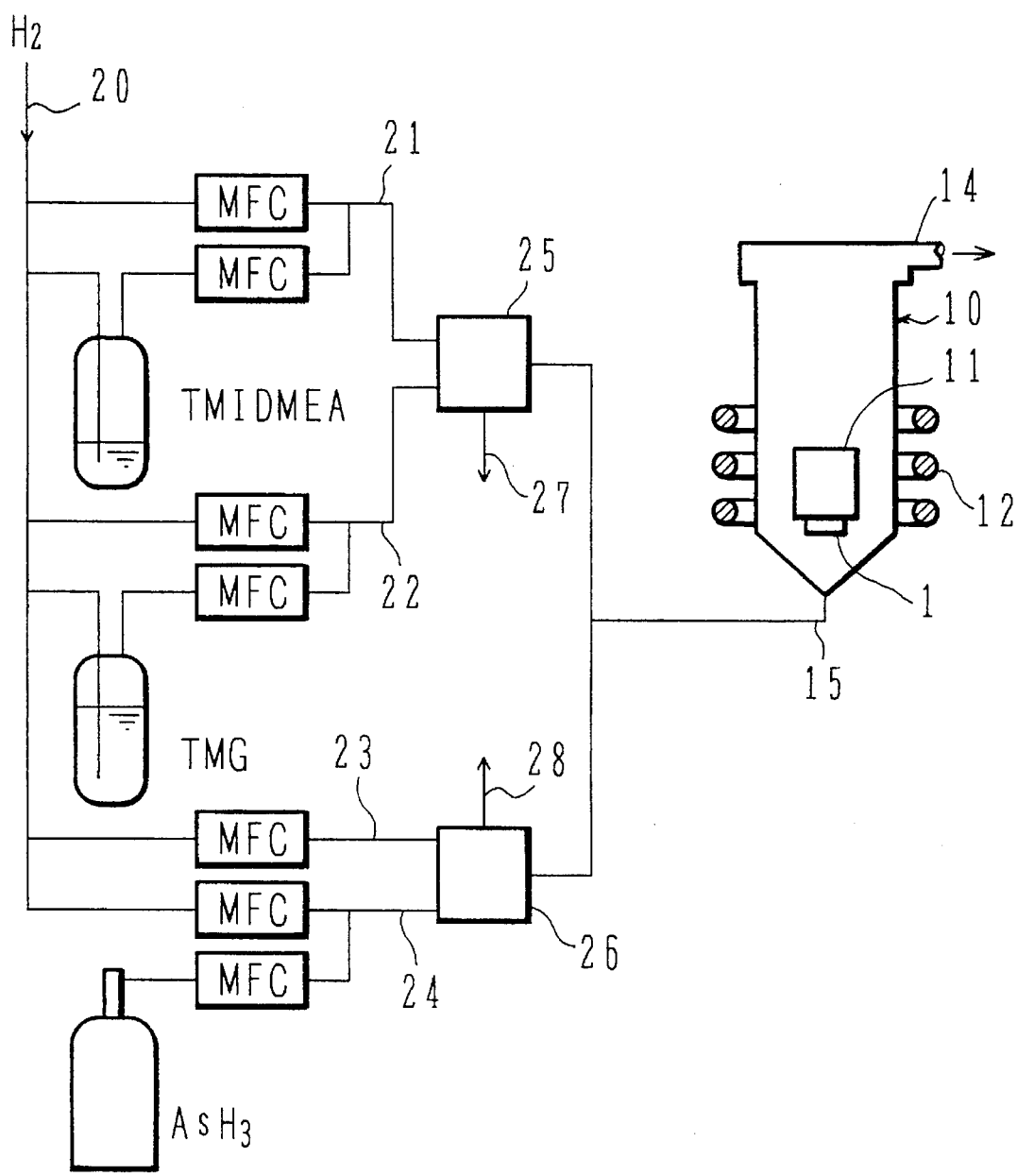
FIG. 2 is a schematic diagram of a low pressure MOCVD apparatus used for manufacturing the semiconductor laminate structure of the first embodiment.

FIG. 2 is a schematic diagram of a low pressure metal organic chemical vapor deposition (MOCVD) system. Crystals are grown by alternately supplying source gases. Crystals may also be grown by atomic layer epitaxy (ALE). A gas flow path 15 is opened at the bottom of a reaction chamber 10 for the introduction of reactant gas into the chamber 10. The reactant gas introduced into the reaction chamber 10 is evacuated to the outside via a gas exhaust pipe 14 communicating with the reaction chamber 10 at the top thereof.

A susceptor 11 is disposed in the reaction chamber 10, and a substrate 1 is held by the susceptor 11 at the position facing the opening of the gas flow path 15. A radio frequency coil 12 is disposed at the outer peripheral area of the reaction chamber 10 so as to surround the susceptor 11, and can inductively heat the susceptor 11 and substrate 1.

$H_2$ gas is supplied from a gas flow path 20 to a gas supply system as carrier gas and purge gas. $H_2$ gas diverted from the gas flow path 20 and $H_2$ gas diverted from the gas flow path 20 and bubbled through trimethylindiumdimethylethylamine (TMIDMEA) aduct are supplied via respective gas flow controllers MFC to a gas flow path 21.

Similarly, $H_2$ gas diverted from the gas flow path 20 and $H_2$ gas diverted from the gas flow path 20 and bubbled through trimethylgallium (TMG) are supplied via respective gas flow controllers MFC to a gas flow path 22.

The gas flow paths 21 and 22 are coupled to the input side of a gas switching valve 25. The output side of the gas switching valve 25 is coupled to a gas flow path 15 for supplying reaction gas to the reaction chamber 10, and alternatively coupled to an exhaust gas flow path 27. By switching between gas flow paths by the gas switching valve 25, $H_2$ gas containing TMIDMEA, $H_2$ gas containing TMG, or both of them can be supplied to the gas flow path 15. Both of them can be exhausted via the exhaust gas flow path 27.

gas diverted from the gas flow path 20 is supplied via a gas flow controller MFC to a gas flow path 23. $H_2$ gas diverted from the gas flow path 20 and arsine ($AsH_3$) are supplied via a gas flow controllers MFC to a gas flow path 24.

The gas flow paths 23 and 24 are coupled to the input side of a gas switching valve 26. The output side of the gas switching valve 26 is coupled, similar to the gas switching valve 25, to the gas flow path 15 and an exhaust gas flow path 28. By switching between gas flow paths by the gas switching valve 26, purge $H_2$ gas or mixed gas of $AsH_3$ and $H_2$ can be supplied to the gas flow path 15. Next, a method of manufacturing the laminate structure shown in FIG. 1 by using the low pressure MOCVD system shown in FIG. 2 will be described.

First, the GaAs substrate 1 is held by the susceptor 11. While $H_2$ gas is flowed as purge gas, the susceptor 12 is heated with the RF coil 12 to raise the substrate temperature to 460° C. The amount of exhaust gas is controlled so as to set the inner pressure of the reaction chamber to 2000 Pa.

When the substrate temperature is raised to 460° C., $H_2$ gas containing TMG and mixed gas of $AsH_3$ and $H_2$ are supplied respectively at flow rates of 25 sccm and 100 sccm to deposit the GaAs buffer layer 2 by MOCVD to a thickness of 100 nm.

Next, TMIDMEA, TMG, and $AsH_3$ are time sequentially switched to deposit the InGaAs quantum box layer 3 to a thickness of 7 nm.

Figure 3:
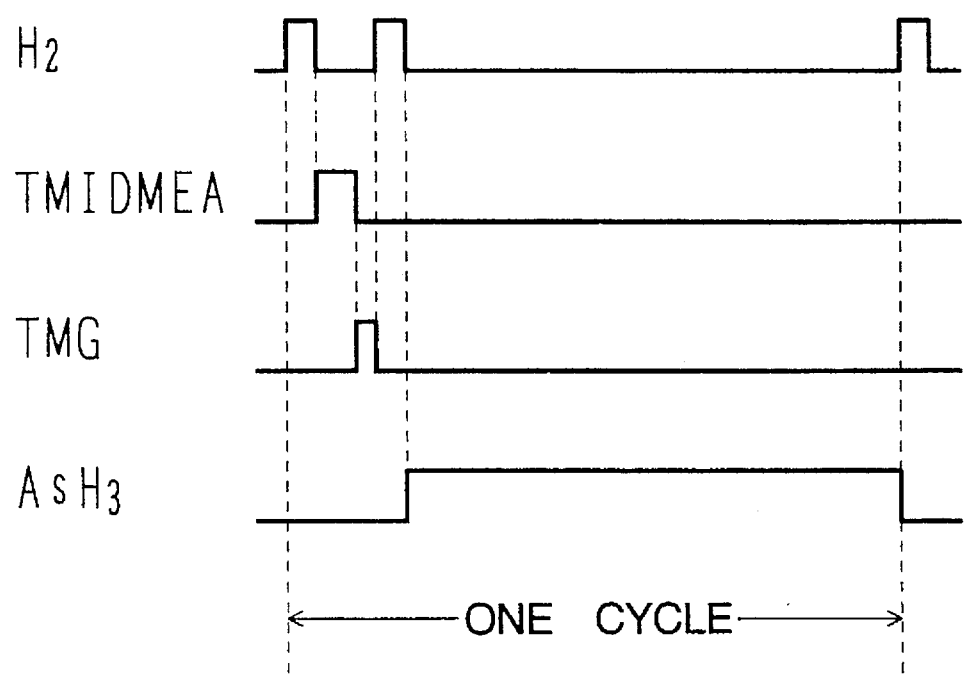
FIG. 3 is a timing chart illustrating reactant gas supply at a quantum box layer forming step for the semiconductor laminate structure of the first embodiment.

FIG. 3 is a timing chart of supplying $H_2$ TMIDMEA, TMG, and $AsH_3$. $H_2$ gas is flowed for 0.5 sec to purge the inside of the reaction chamber 10. Then, $H_2$ gas bubbled through TMIDMEA is supplied for 1.0 sec at a flow rate of 200 sccm, and thereafter $H_2$ gas bubbled through TMG is supplied for 0.1 sec at a flow rate of 35 sccm. $H_2$ gas is supplied for 0.5 sec to purge the inside of the reaction chamber 10. Then, mixed gas of $AsH_3$ and $H_2$ is supplied for 10 sec at a flow rate of 400 sccm.

The above-described gas supply sequence constitutes one cycle, and 12 cycles are repeated for the total gas supply.

Thereafter, the GaAs cap layer 4 is deposited by MOCVD to a thickness of 100 nm under the same conditions as the GaAs layer 2. Other source gases may also be used as metal organic materials.

In the reaction gas supply timing chart shown in FIG. 3, In, Ca, and As source gases are supplied in this order. Other orders may be adopted to supply gases. For example, the order of supplying Ga and In source gases may be reversed. The As source gas may be supplied additionally between the sequences of supplying In and Ga source gases.

Also in the reaction gas supply timing chart shown in FIG. 3, purge $H_2$ gas is supplied when the supply of As source gas is switched from the supply of Ga source gas or when the supply of In source gas is switched from the supply of As source gas. Purge $H_2$ gas may be supplied when other source gases are switched.

In the above embodiment, gas supply cycles are repeated 12 times. The number of repeated cycles is not limited to 12. It is preferable to repeat the gas supply cycle 6 times or more, and more preferable to repeat it 10 to 24 times.

Also in the above embodiment, although the quantum box layer is grown at a temperature of 460° C., it may be grown at a different temperature. For example, the growth temperature is preferably 250° C. to 600° C., and more preferably 420° C. to 500° C.

Figure 4:
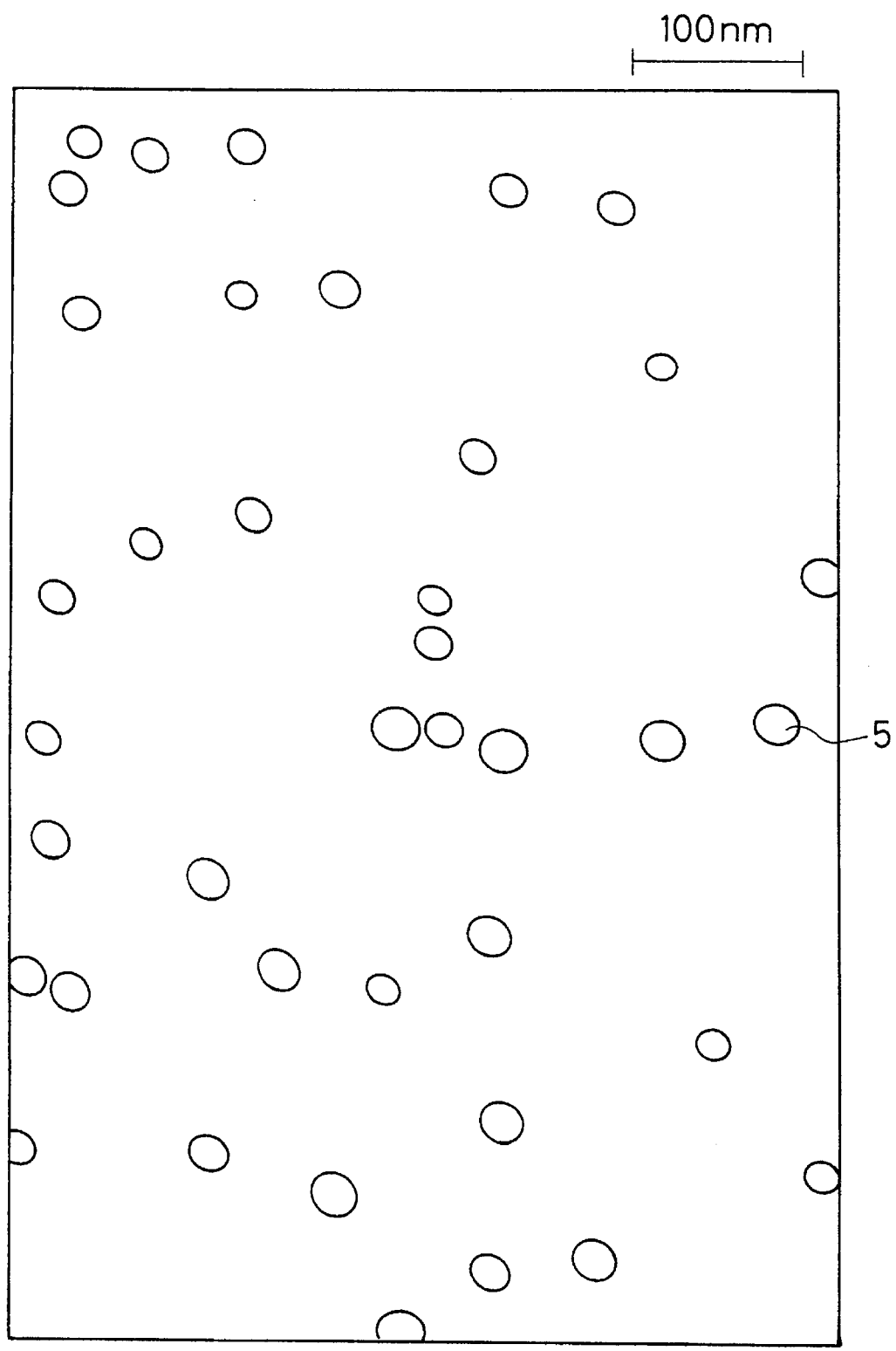
FIG. 4 is a sketch of a transmission electron microscope (TEM) photograph showing the plan view of the quantum box layer of the first embodiment.

FIG. 4 is a sketch of a plan view photograph, taken by a transmission electron microscope (TEM), of the InGaAs quantum box layer 3 deposited under the conditions illustrated in FIG. 3. In the InGaAs region containing less In, there are scattered island regions having a diameter of about 10 nm and containing a higher amount of In composition. Crystal defects are not formed both in the InGaAs region containing less In and the island regions containing much In composition. Crystallinity of a layer with dislocations of the order which cannot be observed by a simple method of measurement is herein called "substantially no dislocation".

Figure 5:
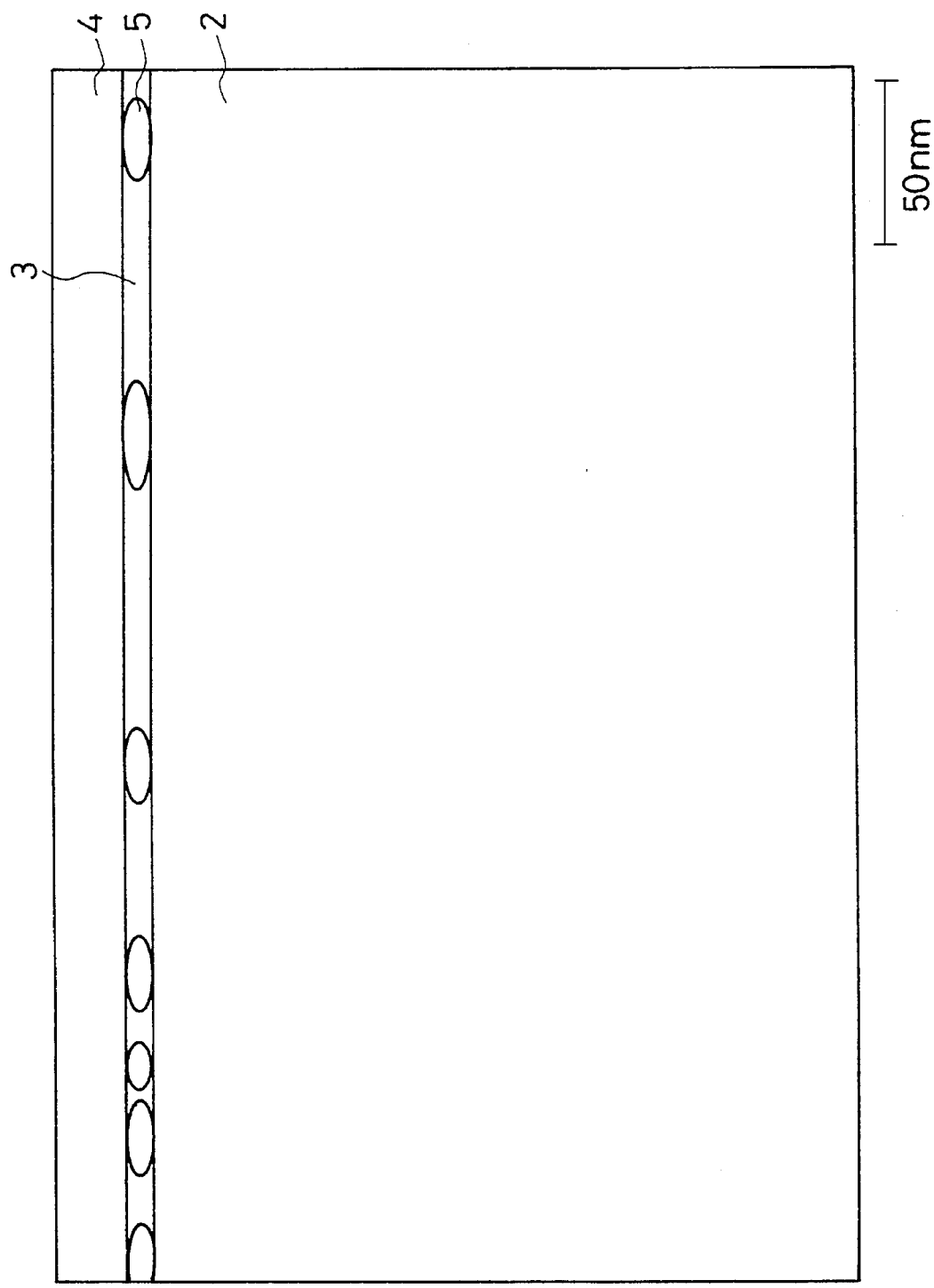
FIG. 5 is a sketch of a TEM photograph showing the cross sectional view of the quantum box layer of the first embodiment.

FIG. 5 is a sketch of a TEM photograph showing a cross section of the InGaAs quantum box layer 3. It is seen from this sketch that the island region 5 having a larger amount of In composition has an oblate sphere shape flattened in the thickness direction of the InGaAs quantum box layer 3.

The reason why the scattered island regions having a larger amount of In composition as shown in FIG. 4 are formed may be considered as in the following.

If TMIDMEA, TMG, and $AsH_3$ are time sequentially supplied, the In composition of a deposited InGaAs layer is generally defined by a supply time period of source gas of each constituent element, and by other factors.

If an InGaAs layer having a uniform In composition over the whole area is deposited on a GaAs buffer layer, strains are generated in the InGaAs layer in the in-plane direction because of lattice mismatch. It is considered that if a broad region, having a small amount of In composition and a lattice constant generally matching the lower level GaAs buffer layer, is formed and regions having a larger amount of In composition are locally formed at scattered areas, strain energy becomes smaller than when strains are generated over the whole area of the InGaAs layer. It is also considered that strain energy becomes smaller as the region having a larger amount of In composition becomes more like a sphere shape.

It is considered from the above reasons that the scattered island regions having a larger amount of In composition are formed in the region having a smaller amount of In composition as shown in FIG. 4.

These island regions having a larger amount of In composition function as three dimensional potential wells of charge carriers, because the island regions have an energy gap smaller than the surrounding regions having a smaller amount of In composition and the upper and lower level GaAs buffer and cap layers. In this manner, the quantum box structure is formed.

A semiconductor layer epitaxially formed on the surface of lattice mismatching semiconductor cannot have a thickness greater than a critical thickness. However, as in the above embodiment, if the compositions of an epitaxially grown film is not uniform and scattered quantum boxes are formed in the film, the film can have a thickness greater than the critical thickness predicted from a lattice mismatch degree.

Figure 6:
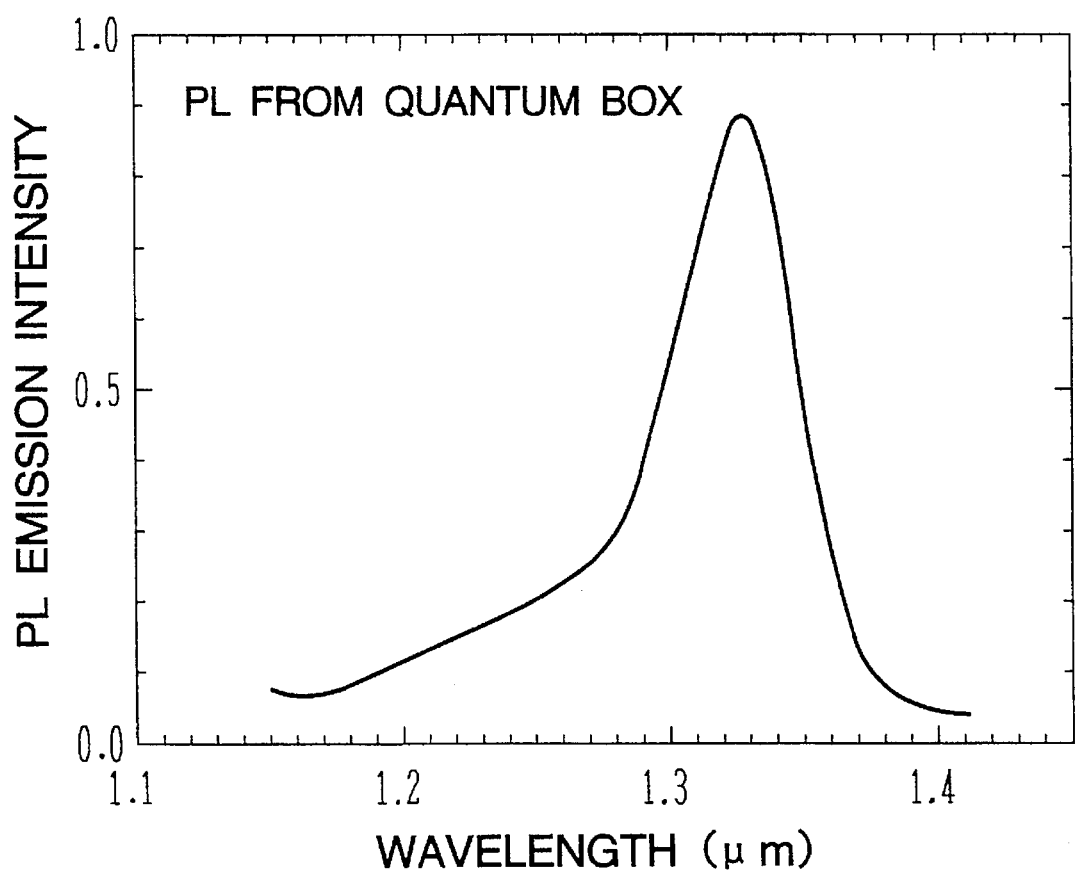
FIG. 6 is a graph showing PL spectra from quantum boxes of the first embodiment.

FIG. 6 shows photoluminescence (PL) spectra from the quantum boxes 5 shown in FIG. 1 at the room temperature. Exciting light was taken from a krypton gas laser. The abscissa represents a PL emission wavelength in the unit of and the ordinate represents a PL emission intensity in relative scale. Observable PL light emission at a room temperature indicates that the laminate structure with quantum boxes has fewer crystal defects which constitute nonradiative centers, and is excellent in crystallinity.

A peak of the PL light emission intensity is at a wavelength of about 1.33 μm. When light absorption coefficient of the InGaAs quantum box layer 3 was measured, an absorption edge was detected at a wavelength of about 1.33 μm. It can be considered from this fact that PL light emission at the wavelength of about 1.33 μm is not generated by level or levels between bands, but is generated by fundamental band edge transition.

It can also be considered, from the In compositions of the quantum boxes 5 and regions of the InGaAs quantum box layer 3 excepting the quantum boxes 5 measured by energy dispersion X-ray (EDX) analysis, that PL emission at the wavelength of 1.33 μm is generated by the quantum boxes 5.

It can be considered that a phenomenon of forming such quantum boxes appears when a film having compositions not lattice matching with the surface of a lower level film is epitaxially grown. It can be therefore considered that quantum boxes will be also formed when an InGaAs layer having a different In composition is formed on an $In_xGa_{1-x}As$ buffer layer, instead of the GaAs buffer layer 2 shown in FIG. 1. In this case, an $In_xGa_{1-x}As$ cap layer is formed in place of the GaAs cap layer 4.

Figure 7A:
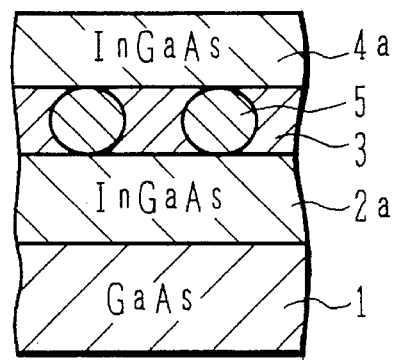
FIGS. 7A and 7B are a cross section of a sample and a graph showing a PL emission wavelength change with an In composition of a buffer layer of samples according to the first embodiment.
Figure 7B:
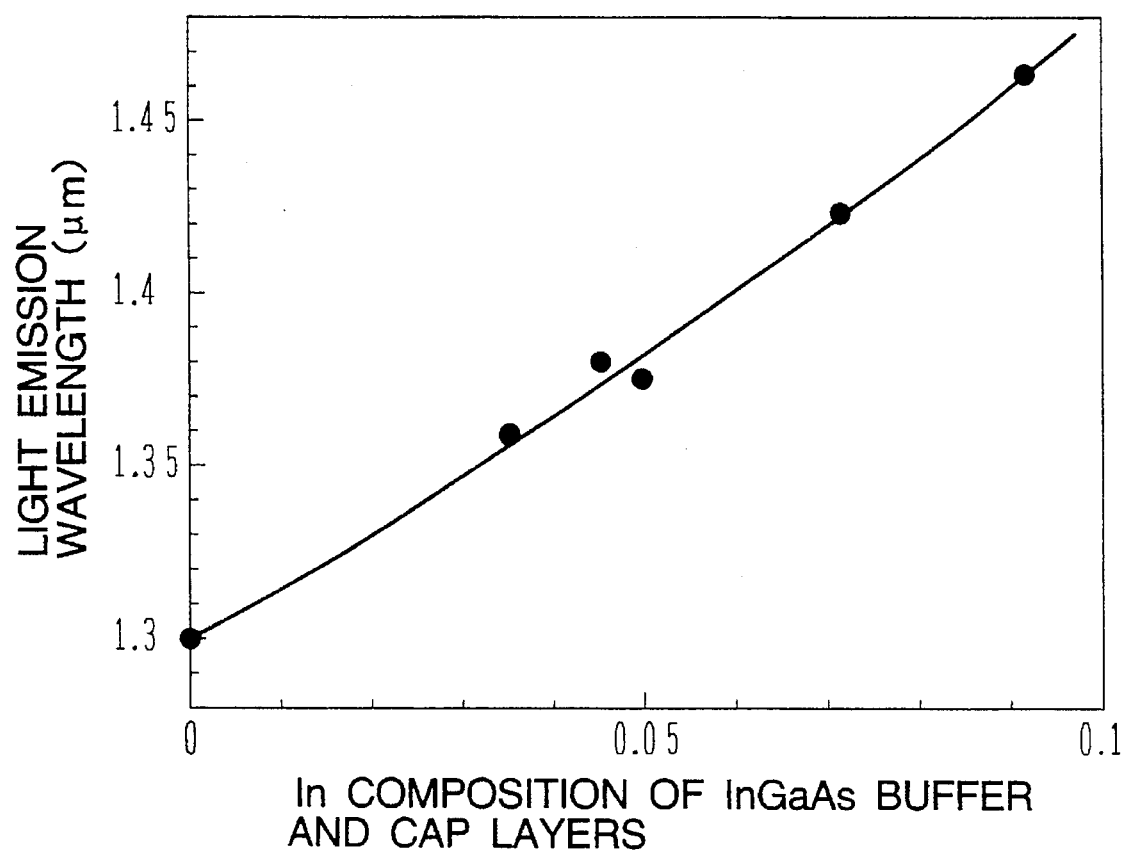

FIG. 7A shows a laminate structure using an $In_xGa_{1-x}As$ buffer layer 2a and an $In_xGa_{1-x}As$ cap layer 4a in place of the GaAs buffer layer 2 and GaAs cap layer 4 shown in FIG. 1. FIG. 7B shows a PL light emission wavelength change with an In composition x of the InGaAs buffer and cap layers 2a and 4a. The abscissa represents an In composition of the buffer and cap layers, and the ordinate represents a light emission wavelength in the unit of μm. The InGaAs quantum box layer was deposited under the same conditions as the embodiment shown in FIG. 1. A sample used for FIG. 6 and samples used for FIG. 7B were prepared at different times and there may be unintentional differences in process parameters.

At the In composition of 0, i.e., if the buffer and cap layers are both made of GaAs, the light emission wavelength is 1.3 μm which may be considered corresponding to the peak wavelength of 1.33 μm shown in FIG. 6. As the In composition increases, the light emission wavelength becomes longer, and at the In composition of 0.09 the light emission wavelength is about 1.45 μm. This means that the light emission wavelength can be controlled by changing the In composition of the buffer and cap layers.

The GaAs buffer and cap layers having a thickness of 100 nm have been described with reference to FIGS. 1 to 7A and 7B. The thicknesses of the buffer and cap layers may be changed. Strains in crystal are relaxed by dislocations in the crystal. Therefore, strains can be relaxed by growing an InGaAs buffer layer on a GaAs substrate thicker and generating dislocations.

Figure 8:
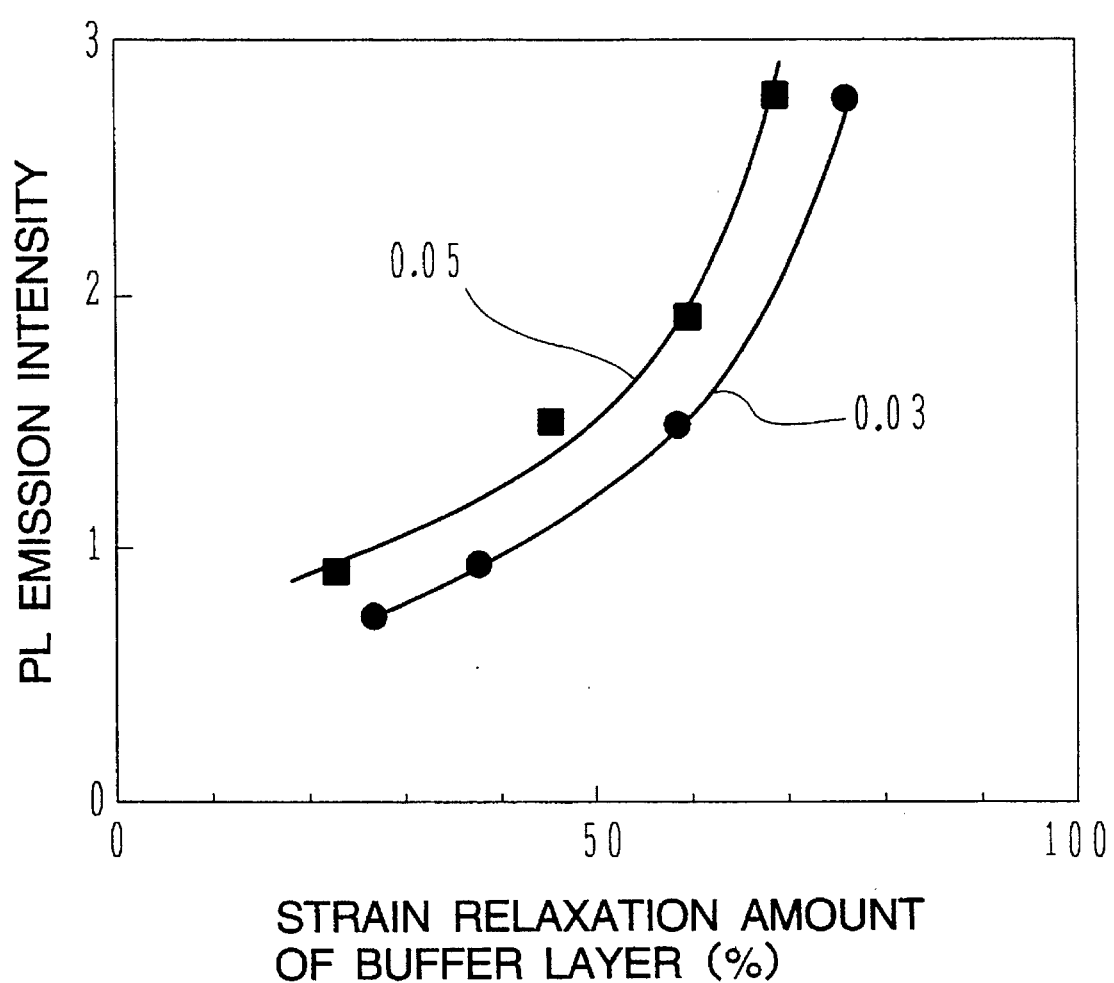
FIG. 8 is a graph showing a PL emission wavelength change with a strain relaxation amount in the buffer layer of the first embodiment.

FIG. 8 shows a PL light emission intensity change with a strain relaxation amount in the buffer layer. The abscissa represents a strain relaxation amount of the buffer layer in the unit of %, and the ordinate represents a PL light emission intensity in relative scale. The strain relaxation amount was defined as $|a-b|/|a-b_o|$ where a represents a lattice constant of a substrate, b represents a lattice constant of the upper surface of a buffer layer, and b0 represents a lattice constant of a buffer layer without strain. The strain relaxation amount was measured by analyzing X-ray diffraction of asymmetric surfaces.

A black (or solid) circle and a black square in FIG. 8 represent PL light emission intensities respectively for the In compositions of 0.03 and 0.05. The PL light emission intensity becomes high as the strain relaxation amount is increased, for both the cases of the In compositions of 0.03 and 0.05. This may be considered resulting from crystallinity of quantum boxes improved by strain relaxation of the buffer layer.

If the strain relaxation amounts of the buffer layers are equal, the PL light emission intensity of the buffer layer having a larger In composition is higher than the buffer layer having a smaller In composition.

In the above embodiment, a reaction gas supply cycle shown in FIG. 3 is repeated 12 times in the process of forming the InGaAs quantum box layer 3 shown in FIG. 3. The number of cycles may be changed.

Figure 9:
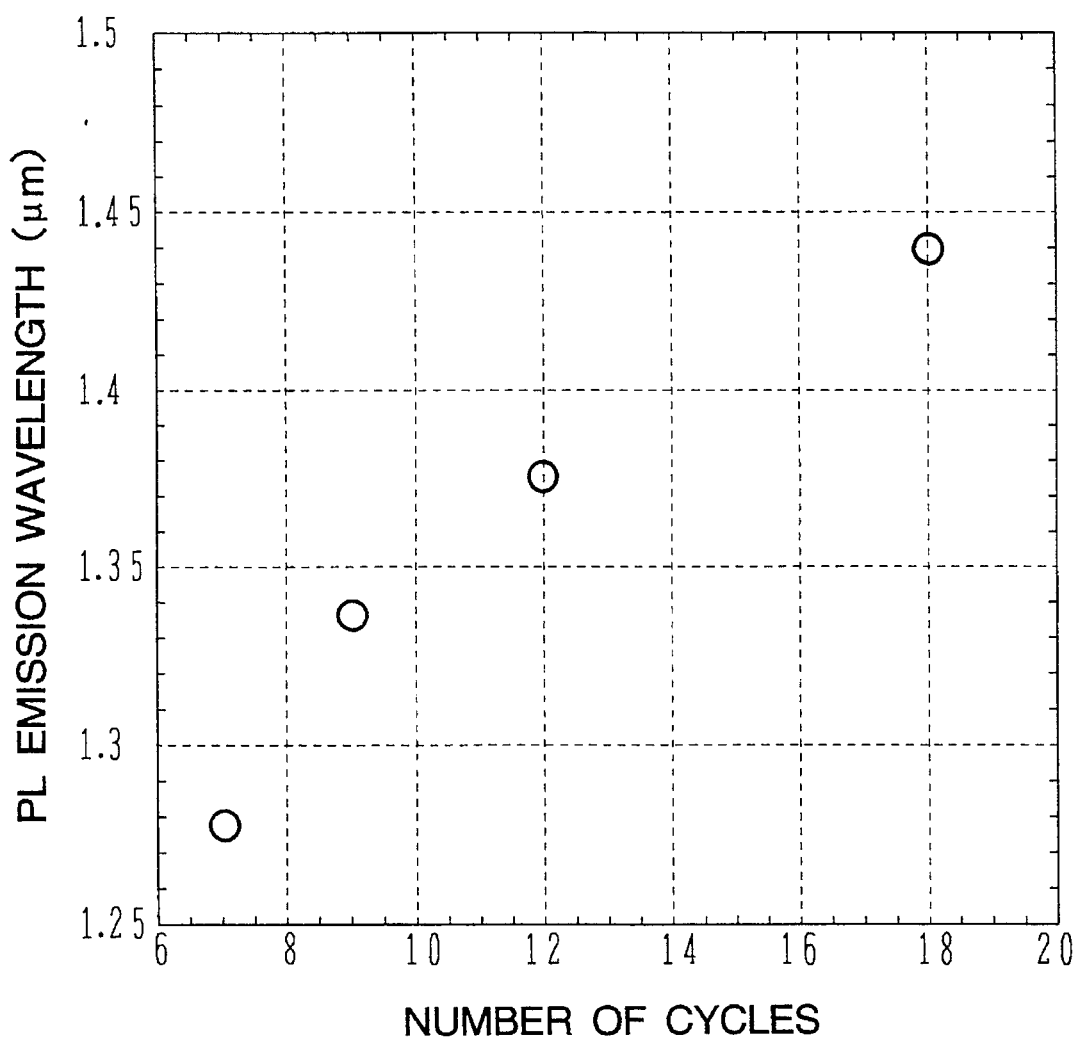
FIG. 9 is a graph showing a PL emission wavelength change with the number of reaction gas supply cycles at a quantum box forming step of the first embodiment.

FIG. 9 is a graph showing a PL light emission wavelength change with the number of reaction gas supply cycles for the formation of the InGaAs quantum box layer 3. The buffer and cap layers sandwiching the InGaAs quantum box layer 3 are both a GaAs layer of 100 nm thick similar to the embodiment shown in FIG. 1. The abscissa represents the number of reaction gas supply cycles, and the ordinate represents a PL light emission wavelength in the unit of μm.

When seven reaction gas supply cycles are used, the PL light emission wavelength is about 1.28 μm. As the number of reaction gas supply cycles is increased, the PL light emission wavelength is gradually elongated. When eighteen reaction gas supply cycles are used, the PL light emission wavelength is about 1.44 μm.

It is seen from this fact that the PL light mission wavelength can be controlled by changing the number of reaction gas supply cycles.

Next, the second embodiment will be described with reference to FIGS. 10 and 11.

Figure 10:
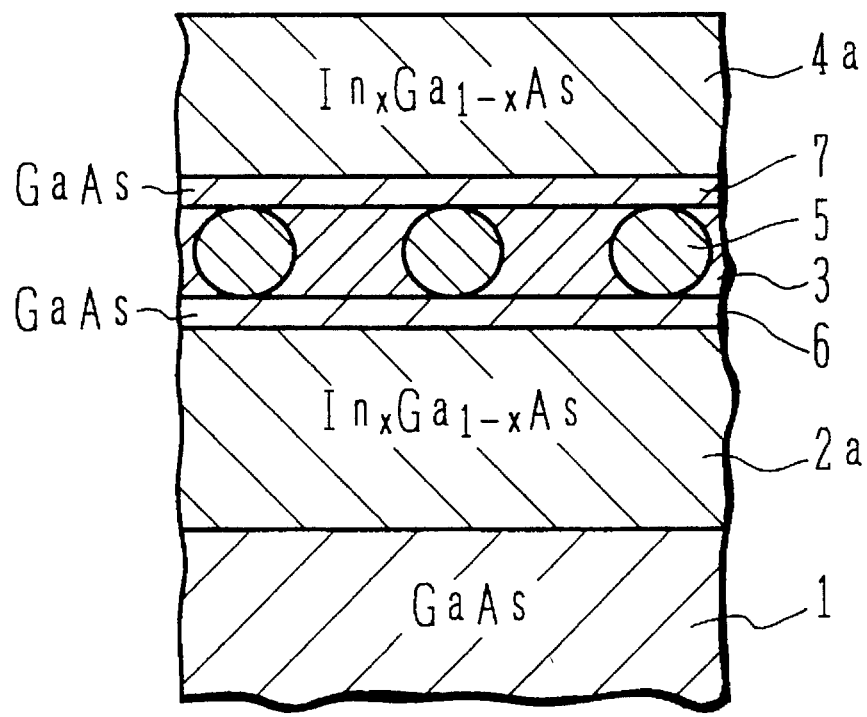
FIG. 10 is a cross sectional view of a semiconductor laminate structure according to a second embodiment.

FIG. 10 shows a laminate structure of the second embodiment. The laminate structure of the first embodiment has the quantum box layer 3 sandwiched between the GaAs buffer and cap layers. The laminate structure of the second embodiment differs from the first embodiment in that a buffer layer 2a and a cap layer 4a are made of InGaAs and that GaAs spacer layers 6 and 7 are formed respectively between a quantum box layer 3 and the buffer layer 2a and between the quantum box layer 3 and the cap layer 4a.

Figure 11:
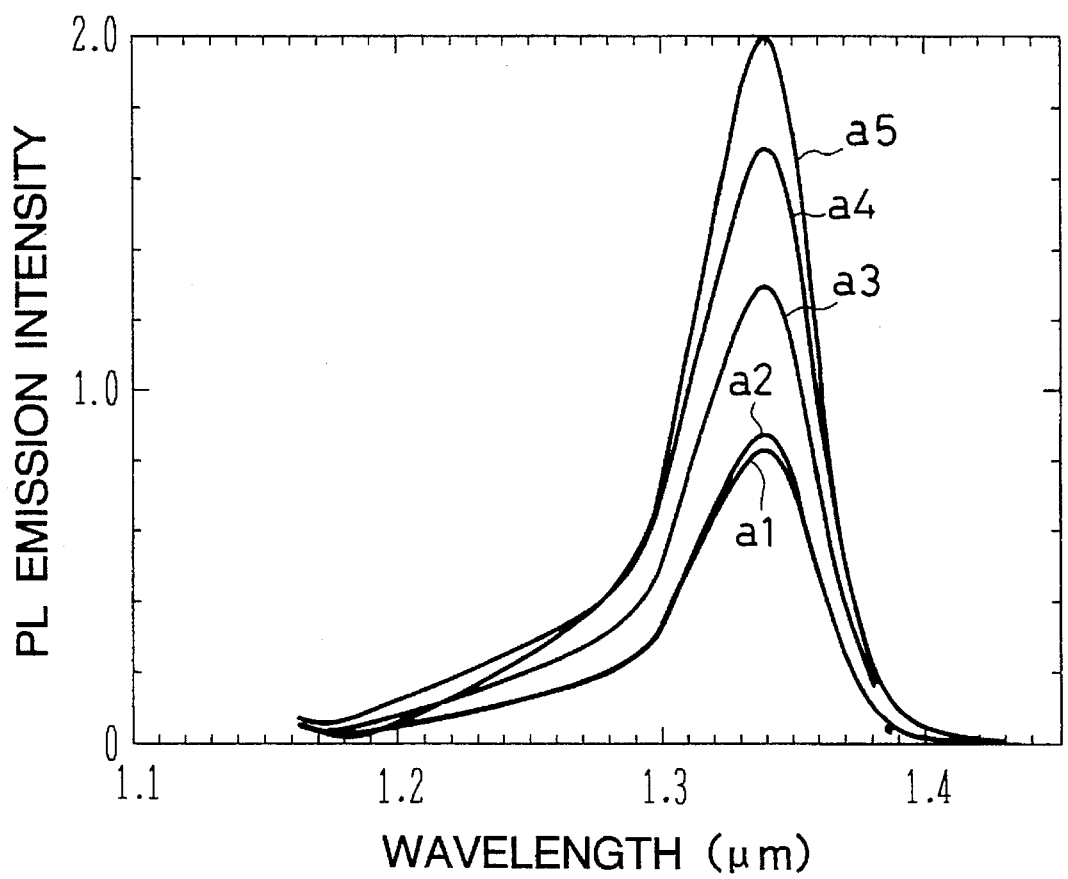
FIG. 11 is a graph showing a PL spectrum change with a thickness of a spacer layer of the second embodiment.

FIG. 11 is a graph showing a PL spectrum change with a thicknesses of the GaAs spacer layers 6 and 7. The abscissa represents a wavelength in the unit of μm, and the ordinate represents a PL light emission intensity in relative scale. Curves a1, a2, a3, a4, and a5 indicate PL spectra respectively for the thicknesses of the spacer layers 6 and 7 of 0 μm, 1 μm, 2 μm, 3 μm, and 4 μm. It is seen from this graph that the spacer layers raise the PL light emission intensity which is further raised by making the space layer thicker. The PL light emission intensity is considerably improved by making the GaAs spacer layers have a thickness of 2 μm or more.

It has been confirmed from the observation of the InGaAs quantum box layer 3 by a TEM that the number of quantum boxes is larger when the spacer layers are formed than when they are not formed. It has been found that In diffuses from the InGaAs quantum box layer 3 into the upper and lower level buffer and cap layers if the spacer layers are not formed. It can be considered that quantum boxes are hard to be formed if In diffuses because strain energy of the InGaAs quantum box layer 3 reduces. It can be also considered that the spacer layers 6 and 7 between the quantum box layer 3 and the buffer and cap layers 2a and 4a function as a diffusion barrier which confines atoms constituting quantum boxes in the InGaAs quantum box layer 3 and makes easy to form quantum boxes.

It can be considered from the above studies that the same effects can be obtained even if the spacer layers 6 and 7 are each made of an InGaAs layer having an In component smaller than the buffer and cap layers 2a and 4a. Crystal having a lattice mismatch with the quantum box layer greater than the buffer layer 2 may be used for forming the spacer layers.

Next, the third embodiment will be described with reference to FIGS. 12 and 13.

In the first and second embodiments, the laminate structure with the quantum box layer is formed on a GaAs substrate. Instead of a GaAs substrate, a ternary (three-element) mixed crystal substrate may be used.

Figure 12:
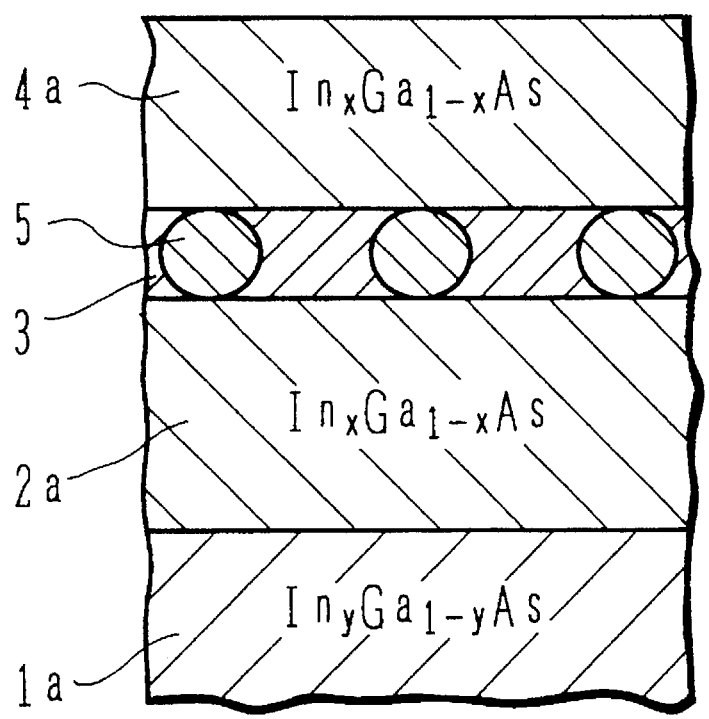
FIG. 12 is a cross sectional view of a semiconductor laminate structure according to a third embodiment.

FIG. 12 shows a laminate structure having an InGaAs buffer layer 2a, an InGaAs quantum box layer 3, and an InGaAs cap layer 4a, respectively stacked on an InGaAs substrate 1a. The In compositions of the InGaAs substrate 1a and InGaAs buffer layer 2a may be the same or different.

Figure 13:
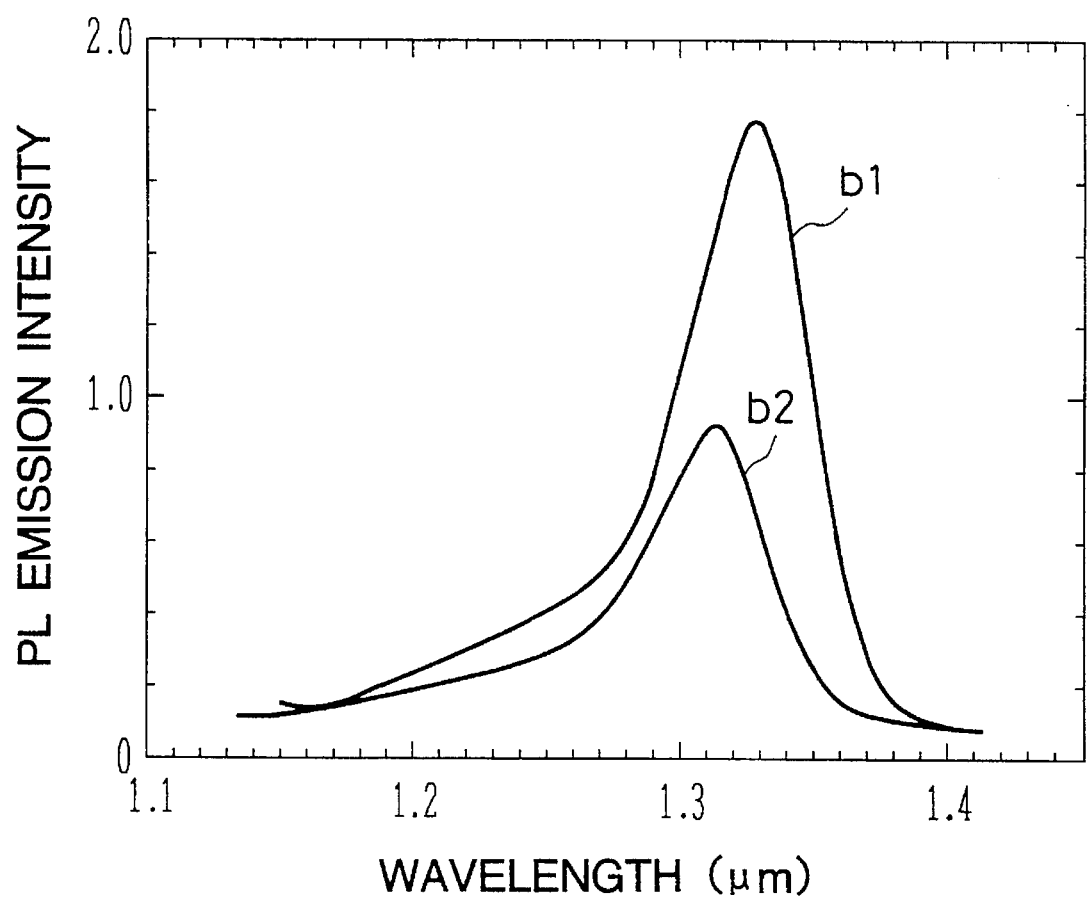
FIG. 13 is a graph showing PL spectra from quantum boxes of the third embodiment and of the first embodiment.

FIG. 13 is a graph showing PL spectra from quantum boxes at a room temperature, respectively of the laminate structures using an InGaAs substrate and a GaAs substrate. The abscissa represents a PL light emission wavelength in the unit of μm, and the ordinate represents a PL light emission intensity in relative scale. The In composition of the InGaAs substrate is 0.05. The In compositions of the InGaAs buffer layer 2a and InGaAs cap layer 4a are both 0.05, and the thicknesses thereof are both 500 nm. The InGaAs quantum box layer 3 was formed by the same method as the first embodiment.

Curves b1 and b2 in FIG. 13 are PL spectrum curves respectively for the structures using the InGaAs substrate and GaAs substrate.

It is seen from this graph that the PL light emission intensity is higher when the InGaAs substrate is used than when the GaAs substrate is used. This may be considered resulting from a larger in-plane lattice constant of the upper surface of the buffer layer 2a when the InGaAs substrate is used than when the GaAs substrate is used.

In the quantum box layers of the first to third embodiments, the In composition of the quantum box region is larger than the other region of the quantum box layer. For example, although the In composition of the quantum box region was about 0.5, the In composition of the remaining region of the quantum box layer was about 0.1. Assuming that the remaining region is GaAs scarcely containing In, the In composition of the quantum box region may take a value of 0.2 to 0.3. As above, the In composition of the quantum box region is larger than the remaining region of the quantum box layer by about 0.2. It is preferable however to set the maximum value of the In composition to about 0.7.

In order that the island region having a large In composition formed in the quantum box layer functions as a quantum box, it is preferable to set the thickness of the quantum box layer to 2 to 40 nm, and more preferably to 5 to 20 nm. The size of each quantum box formed under these conditions has a height generally equal to the thickness of the quantum box layer and a lateral width greater than the height.

In the above embodiments, GaAs or InGaAs is used for the buffer and cap layers, and InGaAs is used for the quantum box layer. Other materials may be used so long as they ensure a certain lattice mismatch between the buffer layer and quantum box layer. The cap layer is not necessarily required to be formed. For example, combinations of materials shown in Table 1 may be used for the substrate, buffer and cap layers, and quantum box layer. For the combinations having the same constituent elements of the buffer layer and quantum box layer, a difference between lattice constants can be obtained by changing the composition ratios of the constituent elements.

TABLE 1

| Combination | I | II | III |
|---|---|---|---|
| Buffer layer (Cap layer) | InAlGaAsPSb | InGaAsP | InGaAsP |
| Quantum box layer | InAlGaAsPSb | InGaAsP | InGaAs |
| Substrate | InP | InAs | Si |
| Combination | IV | V | VI |
| Buffer layer (Cap layer) | InAlGaAsP | AlGaSb | InGaAsP |
| Quantum box layer | InAlGaAsP | InAlGaSb | InGaAs |
| Substrate | GaP | GaSb | Ge |

InSb may also be used for the substrate.

In the first to third embodiments, since a quantum box is formed by lattice mismatch itself, fine pattern fabrication is not needed. The size of quantum boxes is generally uniform because it is determined by a physical energy balance. Furthermore, crystallinity at the region surrounding a quantum box is excellent because no special processing for fine pattern fabrication is performed.

Next, an example of a semiconductor device using quantum boxes will be described with reference to FIGS. 14 and 15.

Figure 14:
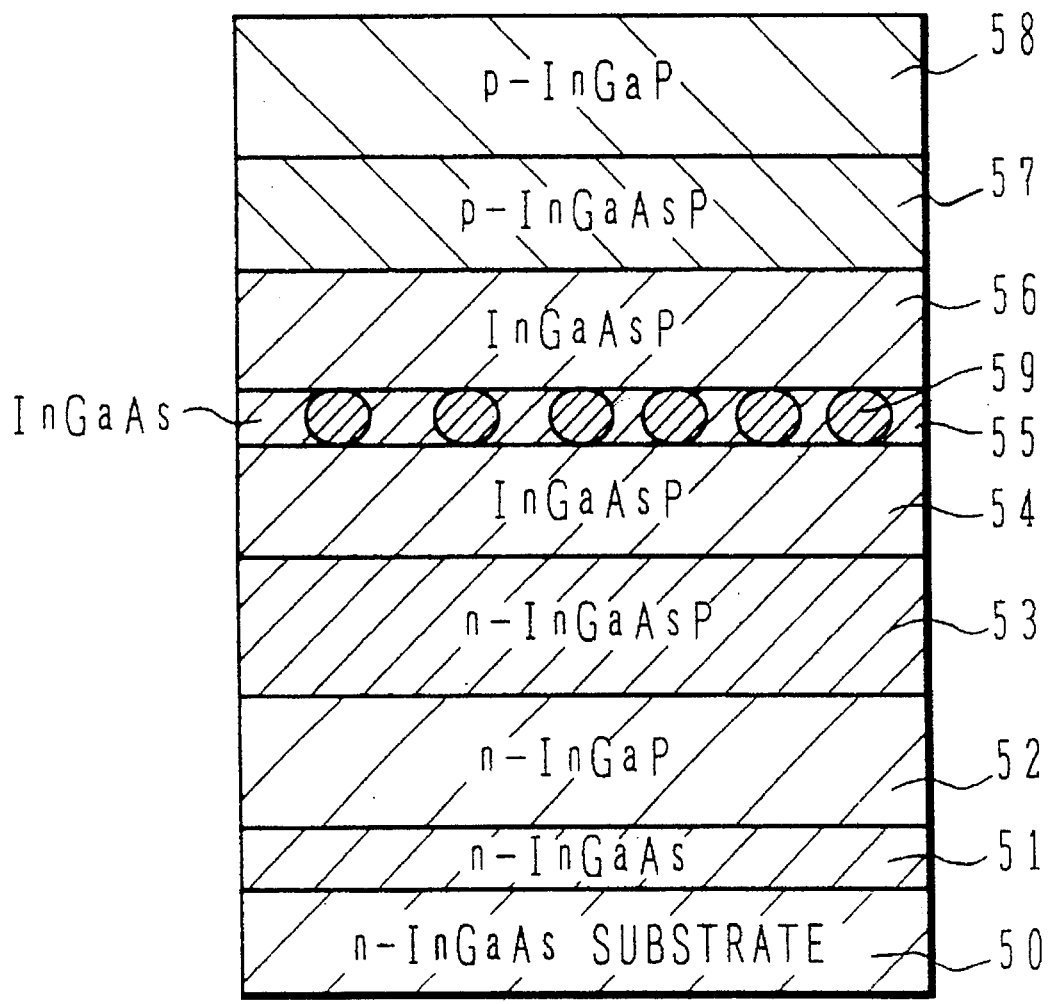
FIG. 14 is a cross sectional view of a semiconductor laser having quantum boxes.

FIG. 14 shows a semiconductor laser having quantum boxes on an active layer. An n-type InGaAs buffer layer 51 of 200 nm thick, an n-type InGaP buffer layer 52 of 400 nm thick, an n-type InGaAsP clad layer 53 of 50 nm thick, an intrinsic InGaAsP guide layer 54 of 10 nm thick, an intrinsic InGaAs active layer 55, an intrinsic InGaAsP guide layer 56 of 10 nm thick, a p-type InGaAsP clad layer 57 of 50 nm thick, and a p-type InGaP contact layer 58 of 400 nm thick are laminated in this order on an n-type InGaAs substrate 50. The layers other than the active layer 55 are lattice-matched.

Lattice mismatch between the InGaAsP guide layer 54 and the InGaAs active layer 55 forms quantum boxes in the active layer 55. Electrons and holes injected into the active layer 55 are confined in quantum boxes having a small band gap and have the energy state of the quantum boxes 59. When the energy state becomes vacant by recombination of a pair of electron and hole in the quantum box 59, an other electron and hole can be enter into the quantum box 59.

In this manner, light emission occurs by recombinations of pairs of electrons and holes in quantum boxes. A semiconductor laser having excellent temperature characteristics can be realized.

Figure 15:
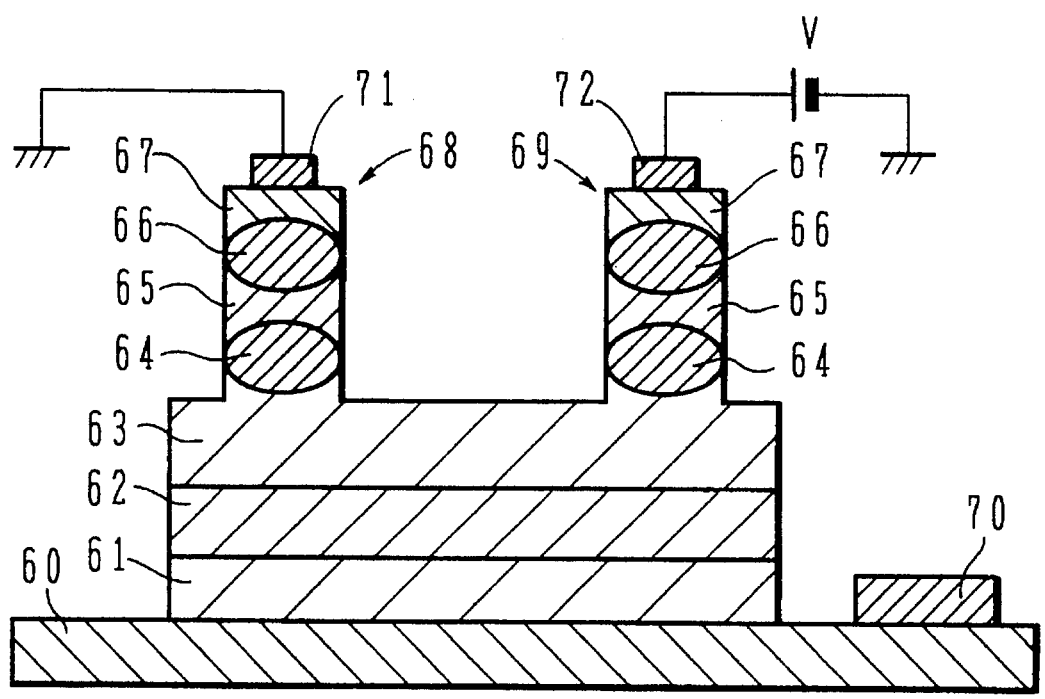
FIG. 15 is a cross sectional view of a double-emitter resonance hot electron transistor (RHET) having quantum boxes.

FIG. 15 is a cross sectional view of a double emitter type resonance hot electron transistor (RHET) having quantum boxes. An n-type AlGaAs layer 61, an intrinsic AlGaAs layer 62, and an n-type AlGaAs layer 63 are formed in this order on an n-type GaAs layer 60. Two mesa structures 68 and 69 are formed on the n-type AlGaAs layer 63, each mesa structure having an InGaAs quantum box 64, an intrinsic AlGaAs layer 65, an InGaAs quantum box 66, and a p-type AlGaAs layer 67, respectively stacked in this order on the n-type AlGaAs layer 63.

A collector electrode 70 is ohmic-contacted to the n-type AlGaAs layer 60. Emitter electrodes 71 and 72 are ohmic-contacted to the highest level n-type AlGaAs layers 67 of the mesa structures 68 and 69.

The InGaAs quantum boxes 64 and 66 are not necessarily required to have coincident in-plane positions. It is considered that if the intrinsic AlGaAs layer 65 is made thin, the in-plane positions are made coincident naturally.

By utilizing the RHET structure shown in FIG. 15, a logic circuit operating by one electron can be configured. If this structure is applied to a semiconductor memory device, a memory of one bit can be configured by a minimum pattern of about several tens nm, and the integration can be improved ideally up to terabits.

The present invention has been described in connection with the preferred embodiments. The invention is not limited only to the above embodiments. It will be apparent to those skilled in the art that various modifications, improvements, combinations and the like can be made without departing from the scope of the appended claims.

We claim:

1. A semiconductor device comprising:

an underlie having a semiconductor surface capable of growing thereon single crystal; and a first semiconductor layer, said first semiconductor layer including:

a first region of group III–V compound semiconductor epitaxially grown on generally the whole area of said semiconductor surface; and second regions of group III–V compound semiconductor disposed and scattered in said first region, said second region having a different composition ratio of constituent elements from said first region, wherein lattice constants of said first and second regions in no strain state differ from a lattice constant of said semiconductor surface, and a difference between the lattice constant of said second region in no strain state and the lattice constant of said semiconductor surface is greater than a difference between the lattice constant of said first region in no strain state and the lattice constant of said semiconductor surface.

2. A semiconductor device according to claim 1, wherein said first semiconductor layer has a thickness of 2 to 40 nm, and said second region has an oblate sphere shape flattened in a thickness direction of said first semiconductor layer, a height of said second region being generally the same as a thickness of said first semiconductor layer.

3. A semiconductor device according to claim 2, wherein said first semiconductor layer is group III–V compound semiconductor containing In as a group III element, and a molar composition ratio of In of said second region to all group III elements is about 0.7 or smaller and is larger than a molar composition ratio of In of said first region by about 0.2 or more.

4. A semiconductor device according to claim 1, further comprising a second semiconductor layer formed on said first semiconductor layer, said second semiconductor layer having generally the same lattice constant as the lattice constant of said semiconductor surface.

5. A semiconductor device according to claim 1, wherein said underlie includes a substrate having an upper surface and a third semiconductor layer epitaxially grown on the upper surface of said substrate, said third semiconductor layer being formed with said semiconductor surface on an upper surface thereof.

6. A semiconductor device according to claim 5, wherein said substrate is made of a material selected from a group consisting of GaAs, InP, InAs, GaP, GaSb, InSb, InGaAs, Si, and Ge.

7. A semiconductor device according to claim 5, wherein a lattice constant of said third semiconductor layer in no strain state differs from a lattice constant of an upper surface of said semiconductor substrate, and strains in an upper portion of said third semiconductor layer are more relaxed than in a lower portion thereof.

8. A semiconductor device according to claim 5, further comprising a first spacer layer of group III–V compound semiconductor formed between said third semiconductor layer and said first semiconductor layer, wherein a difference between the lattice constant of said second region in no strain state and a lattice constant of said first space layer in no strain state is greater than a difference between the lattice constant of said second region in no strain state and the lattice constant of said semiconductor surface.

9. A semiconductor device according to claim 8, wherein a thickness of said first spacer layer is 2 nm or more.

10. A semiconductor device according to claim 5, further comprising a second spacer layer of group III–V compound semiconductor directly formed on an upper surface of said first semiconductor layer, wherein a difference between the lattice constant of said second region in no strain state and a lattice constant of said second space layer in no strain state is greater than a difference between the lattice constant of said second region in no strain state and the lattice constant of said semiconductor surface.

11. A semiconductor device according to claim 10, wherein a thickness of said second spacer layer is 2 nm or more.

12. A semiconductor device according to claim 1, wherein said first semiconductor layer has a composition of $In_xAl_yGa_{1-x-y}As_uP_vSb_{1-u-v}$ ($0 \leq x \leq 1$, $0 \leq y \leq 1$, $0 \leq u \leq 1$, $0, v \leq 1$).

13. A semiconductor device comprising a mixed crystal layer made of mixed crystal semiconductor having a lattice constant changing with a composition, said mixed crystal layer including second regions of an oblate sphere shape in a first region of a thin film having a generally constant mixed crystal composition, said second region having a different mixed crystal composition from the mixed crystal composition of said first region.

14. A semiconductor device according to claim 13, wherein said mixed crystal semiconductor layer has substantially no dislocation.

15. A semiconductor device according to claim 13, further comprising a substrate for supporting said mixed crystal semiconductor layer and a buffer layer of mixed crystal semiconductor interposed between said mixed crystal semiconductor layer and said substrate.

16. A semiconductor device according to claim 13, wherein said mixed crystal semiconductor layer has a thickness in a range of about 2 to 40 nm.

17. A semiconductor device according to claim 16, wherein said mixed crystal semiconductor layer has a thickness in a range of about 5 to 20 nm.

18. A semiconductor device according to claim 13, wherein said second region has a band gap narrower than said first region.

* * * * *